United States Patent
Saito

(10) Patent No.: US 10,056,516 B2
(45) Date of Patent: Aug. 21, 2018

(54) SOLAR PANEL

(71) Applicant: CASIO COMPUTER CO., LTD., Shibuya-ku, Tokyo (JP)

(72) Inventor: Yuta Saito, Kokubunji (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 532 days.

(21) Appl. No.: 14/011,615

(22) Filed: Aug. 27, 2013

(65) Prior Publication Data

US 2014/0060614 A1     Mar. 6, 2014

(30) Foreign Application Priority Data

Sep. 4, 2012 (JP) ................. 2012-194105

(51) Int. Cl.
| | |
|---|---|
| *H01L 31/05* | (2014.01) |
| *G04C 10/02* | (2006.01) |
| *H01L 31/0465* | (2014.01) |
| *H01L 31/046* | (2014.01) |

(52) U.S. Cl.
CPC .......... *H01L 31/0508* (2013.01); *G04C 10/02* (2013.01); *H01L 31/046* (2014.12); *H01L 31/0465* (2014.12); *Y02E 10/50* (2013.01)

(58) Field of Classification Search
CPC ..................................... G04C 10/02
USPC ......................................... 136/244
See application file for complete search history.

(56) References Cited

U.S. PATENT DOCUMENTS

| | | | | |
|---|---|---|---|---|
| 3,427,797 A | * | 2/1969 | Negoro ................. | G04C 10/02 136/249 |
| 3,786,624 A | * | 1/1974 | Uchiyama ..................... | 368/205 |
| 3,890,776 A | * | 6/1975 | Urushida ...................... | 368/205 |
| 5,714,773 A | * | 2/1998 | Burrows ............... | H01L 27/144 257/432 |
| 2002/0029798 A1 | * | 3/2002 | Miyoshi ................ | G04C 10/02 136/244 |
| 2002/0167867 A1 | * | 11/2002 | Ito ................................ | 368/203 |
| 2004/0069341 A1 | * | 4/2004 | Heidrich ....................... | 136/244 |

FOREIGN PATENT DOCUMENTS

JP        10-039057 A        2/1998

* cited by examiner

*Primary Examiner* — Sadie White
(74) *Attorney, Agent, or Firm* — Holtz, Holtz & Volek PC

(57) ABSTRACT

A solar panel of the present invention includes a plurality of solar cells arranged in a substantially circular shape, and a plurality of connection sections which are provided near a center portion where the plurality of solar cells are all close to each other, and electrically connect the plurality of solar cells. Therefore, the plurality of connection sections can be centrally placed near the center portion where the plurality of solar cells are all close to each other. As a result, a decrease in the light-receiving area due to the plurality of connection sections can be reduced, and fluctuations in the light-receiving area due to pointers moving over the solar cells can be reduced.

13 Claims, 11 Drawing Sheets

SOLAR PANEL

CROSS-REFERENCE TO RELATED APPLICATION

This application is based upon and claims the benefit of priority from the prior Japanese Patent Application No. 2012-194105, filed Sep. 4, 2012, the entire contents of which are incorporated herein by reference.

BACKGROUND OF THE INVENTION

1. Field of the Invention

The present invention relates to a solar panel for use in an electronic device such as a timepiece.

2. Description of the Related Art

For example, in a solar panel for use in a wristwatch, a plurality of solar cells each having a power-generating layer between a lower electrode and an upper electrode are arranged in a circular shape, as described in Japanese Patent Application Laid-Open (Kokai) Publication No. 10-039057.

The known solar panel is structured such that the outer perimeters of the plurality of these solar cells are electrically connected by a plurality of connection sections.

This type of solar panel is structured such that, when the solar cells adjacent to each other are to be electrically connected by the plurality of connection sections, the lower electrode of one of the solar cells adjacent to each other and the upper electrode of the other solar cell adjacent thereto are connected by the connection section in the outer perimeters of the solar cells, whereby the plurality of solar cells are electrically connected.

However, since the plurality of connection sections are provided to the outer perimeters of the solar cells in the solar panel as described above, when the plurality of connection sections are covered by a cover plate, the cover plate hides light-receiving sections on the outer perimeters of the plurality of solar cells, and therefore there is a problem in that the light-receiving area of each solar cell is significantly decreased.

Moreover, in the solar panel described above, the whole current amount is determined by the current amount of a solar cell having the smallest area among a plurality of solar cells, whereby the light-receiving area of each solar cell is significantly changed depending on the positions of the plurality of pointers moving over the solar panel.

Accordingly, this solar panel has problems in that the light-receiving area is decreased, losses of the generated power are increased and the power generation efficiency is low.

SUMMARY OF THE INVENTION

The present invention is to provide a solar panel capable of enhancing power generation efficiency by increasing a light-receiving area and reducing losses of electric power due to changes of the light-receiving area.

In accordance with one aspect of the present invention, there is provided a solar panel comprising a plurality of fan-shaped solar cells arranged in a substantially circular shape; a plurality of connection sections which are provided near a center portion where the plurality of fan-shaped solar cells are all close to each other, and electrically connect the plurality of fan-shaped solar cells; and a shaft insertion hole provided at the center portion where the plurality of fan-shaped solar cells are all close to each other, in which a pointer shaft for moving a pointer is inserted.

The above and further objects and novel features of the present invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

FIG. 3A and FIG. 3B each depict a pointer of the timepiece module depicted in FIG. 1, of which FIG. 3A is an enlarged front view of an hour hand and FIG. 3B is an enlarged front view of a minute hand;

DETAILED DESCRIPTION OF THE PREFERRED EMBODIMENTS

First Embodiment

A first embodiment in which the present invention has been applied to a pointer-type wristwatch is described below with reference to FIG. 1 to FIG. 6.

Figure 1:
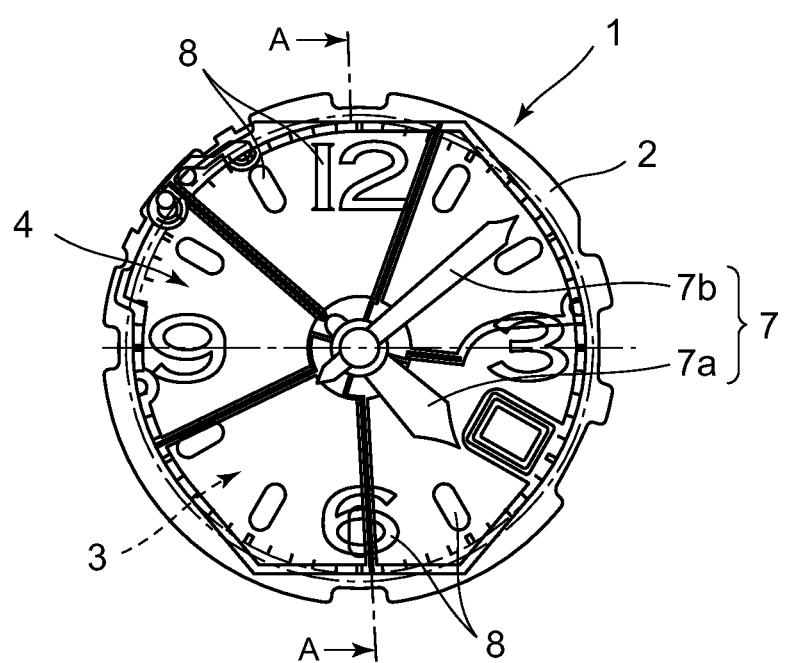
FIG. 1 is an enlarged front view of a timepiece module in a first embodiment in which the present invention has been applied to a wristwatch.
Figure 2:
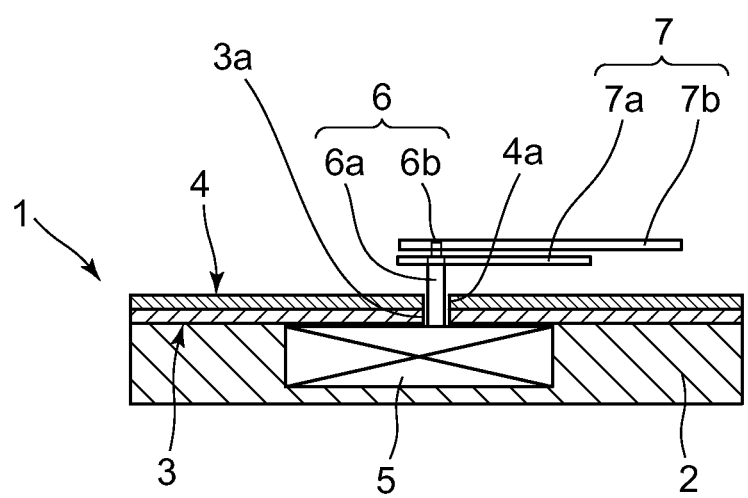
FIG. 2 is an enlarged sectional view of the timepiece module taken along line A-A in FIG. 1.
Figure 3A:
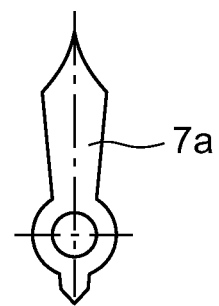
Figure 3B:
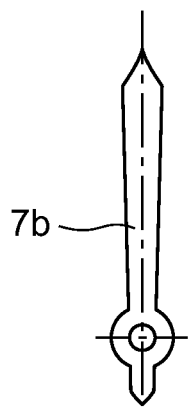

The wristwatch includes a timepiece module 1, as depicted in FIG. 1 and FIG. 2.

The timepiece module 1 has a housing 2 and is arranged in a wristwatch case (not shown).

The housing 2 has a solar panel 3 arranged on the upper surface thereof, and the solar panel 3 has a dial plate 4 arranged on the upper surface thereof, as depicted in FIG. 1 and FIG. 2.

Also, the housing 2 has a timepiece movement 5 provided therein.

The timepiece movement 5 is structured to more pointers 7 such as an hour hand 7a and a minute hand 7b by rotating a pointer shaft 6.

In this case, the dial plate 4 is made of a transparent or translucent film, and is formed in a substantially circular shape, as depicted in FIG. 1.

The dial plate 4 has hour characters 8 provided on an edge portion on the upper surface thereof with predetermined intervals, as depicted in FIG. 2.

The pointer shaft 6 has a cylindrical hour hand shaft 6a and a minute hand shaft 6b rotatably arranged on the hour hand shaft 6a.

The pointer shaft 6 is structured to project upward from the dial plate 4 through a shaft insertion hole 3a provided at the center portion of the solar panel 3 and a shaft insertion hole 4a provided at the center portion of the dial plate 4.

The pointers are each mounted on an upper end portion of the pointer shaft 6, as depicted in FIG. 1, FIG. 2, FIG. 3A and FIG. 3B.

That is, the hour hand 7a is mounted on an upper end portion of the hour hand shaft 6a of the pointer shaft 6, and the minute hand 7b is mounted on an upper end portion of the minute hand shaft 6b of the pointer shaft 6.

As a result, the timepiece movement 5 is structured to indicate time with the pointers 7 such as the hour hand 7a and the minute hand 7b moving above the dial plate 4 when the pointer shaft 6 is rotated.

Figure 4:
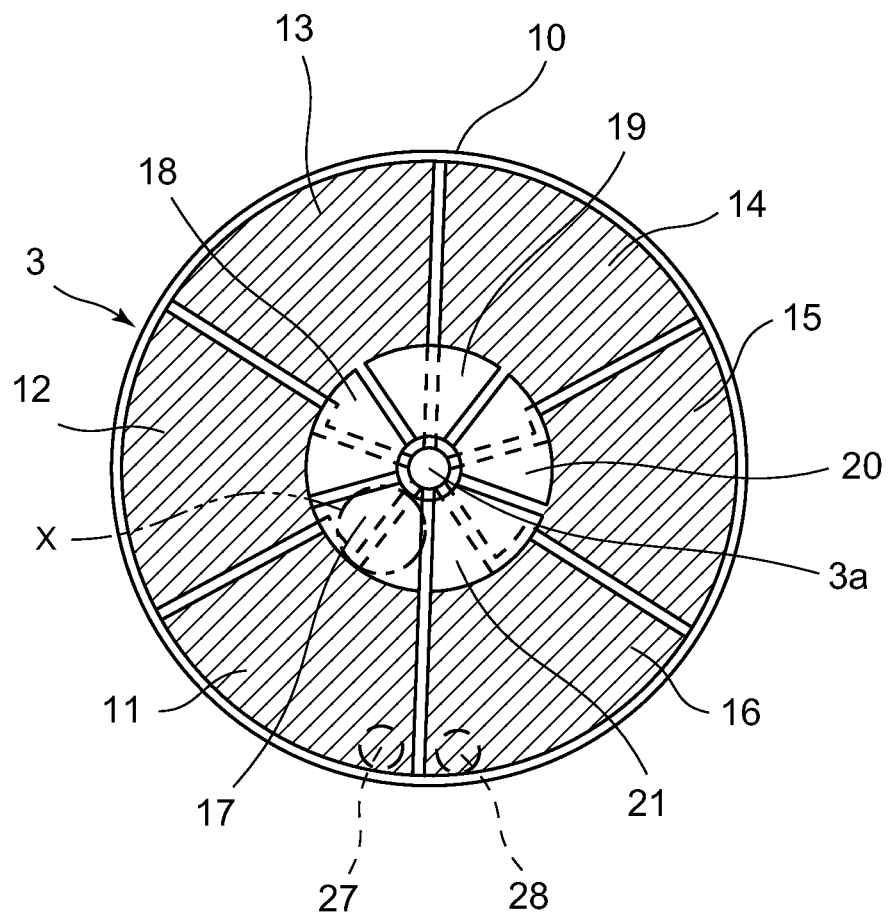
FIG. 4 is an enlarged front view of a solar panel of the timepiece module depicted in FIG. 1.

The solar panel 3 is formed in a substantially circular shape whose size is equal to the size of the dial plate 4, as depicted in FIG. 1 and FIG. 4.

The solar panel 3 includes a plurality of solar cells 11 to 16.

These solar cells 11 to 16 are arranged on the upper surface of a film substrate 10 in a circular shape with the shaft insertion hole 3a as a center, as depicted in FIG. 4.

In this case, the plurality of solar cells 11 to 16 are formed by dividing a circle into six pieces having an approximately fan shape, which have identical light-receiving areas even when their shapes are formed to be different.

The plurality of solar cells 11 to 16 are electrically connected to each other with a plurality of connection sections 17 to 21 provided near a center portion where the solar cells are all close to each other, as depicted in FIG. 4.

That is, these connection sections 17 to 21 are structured to sequentially connect, in series, the plurality of solar cells 11 to 16 adjacent to each other.

Figure 5:
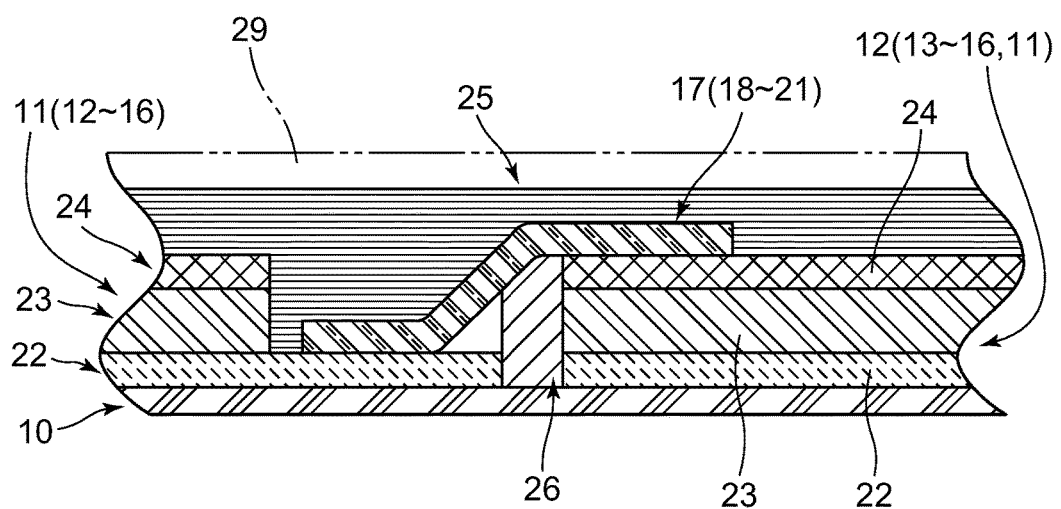
FIG. 5 is an enlarged sectional view of an X section of the solar panel depicted in FIG. 4.

In this case, the solar cells 11 to 16 each have a lower electrode 22 made of metal such as aluminum pattern-formed on the film substrate 10, as depicted in FIG. 5. On the lower electrode 22, a power-generating layer 23 made of a semiconductor layer such as amorphous silicon (a-S1) is pattern-formed. On the power-generating layer 23, an upper electrode 24 made of ITO (Indium Tin Oxide) or the like is pattern-formed. The upper electrode 24 is structured to be covered by a protective film 25 made of insulating transparent synthetic resin.

As a result, in each of the plurality of solar cells 11 to 16, when external light such as sunlight is applied to the transparent protective film 25, the applied external light passes through the protective film 25 and the transparent upper electrode 24 to enter the power-generating layer 23, as depicted in FIG. 5.

Then, in each of the plurality of solar cells 11 to 16, the power-generating layer 23 generates an electromotive force by the incident external light and thereby generates electric power.

On the other hand, the plurality of connection sections 17 to 21 are provided near the center portion where the plurality of solar cells 11 to 16 are all close to each other, as depicted in FIG. 4.

That is, the plurality of connection sections 17 to 21 are provided in an annular shape along the outer perimeter of the shaft insertion hole 3a provided to vertically penetrate through the center portion of the film substrate 10 on the solar panel 3.

In this case, the plurality of connection sections 17 to 21 are preferably provided at a position as close as possible to the outer perimeter of the shaft insertion hole 3a. Also, the spacing between the plurality of connection sections 17 to 21 is preferably as short as possible.

Each dividing line of the plurality of solar cells 11 to 16 at the position where each of the plurality of connection sections 17 to 21 is provided is located at a position acquired by 360 degrees being substantially equally divided with the shaft insertion hole 3a as the center, as depicted in FIG. 4.

That is, the solar cells 11 to 16 where the plurality of connection sections 17 to 21 are arranged are formed by equidistant division in a circumferential direction of each solar cell.

The plurality of connection sections 17 to 21 are each formed of a conductive paste, as depicted in FIG. 5.

The plurality of connection sections 17 to 21 are each structured to connect the lower electrode 22 of one of solar cells adjacent to each other among the solar cells 11 to 16 and the upper electrode 24 of the other solar cell adjacent to this solar cell.

In this case, among the solar cells 11 to 16 adjacent to each other, the first solar cell 11 and the second solar cell 12 are separated by an insulating layer 26 formed therebetween, as depicted in FIG. 5.

The first solar cell 11 positioned in an area adjacent to the insulating layer 26 has the upper electrode 24 and the power-generating layer 23 partially removed by etching, and thereby a sufficiently wide portion of the lower electrode 22 is exposed.

That is, the exposed portion of the lower electrode 22 is formed to have a sufficiently wide area necessary for the connection section 17 to connect the lower electrode 22 and the upper electrode 24 adjacent thereto, as depicted in FIG. 5.

As a result, the upper surface of the lower electrode 22 of the exposed first solar cell 11 and the upper surface of the upper electrode 24 of the second solar cell 12 adjacent to the first solar cell 11 are electrically connected to each other by the connection section 17 with high connection reliability.

As depicted in FIG. 5, the connection section 17 is formed by applying the conductive paste over the upper surface of the lower electrode 22 of the first solar cell 11 and the upper surface of the upper electrode 24 of the second solar cell 12 adjacent thereto in a manner to cover the insulating layer 26, and patterning the applied conductive paste.

In this case, the connection section 17 is pattern-formed so as not to come in contact with the upper electrode 24 of the first solar cell 11 and the power-generating layer 23.

The upper electrode 24 of the first solar cell 11, the upper electrode 24 of the second solar cell 12, and the connection section 17 are covered by the insulating transparent protective film 25.

The lower electrode 22 of the second solar cell 12 and the upper electrode 24 of the third solar cell 13 are electrically connected by the connection section 18, as depicted in FIG. 4.

The lower electrode 22 of the third solar cell 13 and the upper electrode 24 of the fourth solar cell 14 are electrically connected by the connection section 19.

The lower electrode 22 of the fourth solar cell 14 and the upper electrode 24 of the fifth solar cell 15 are electrically connected by the connection section 20, as depicted in FIG. 4.

The lower electrode 22 of the fifth solar cell 15 and the upper electrode 24 of the sixth solar cell 16 are electrically connected by the connection section 21.

Figure 6:
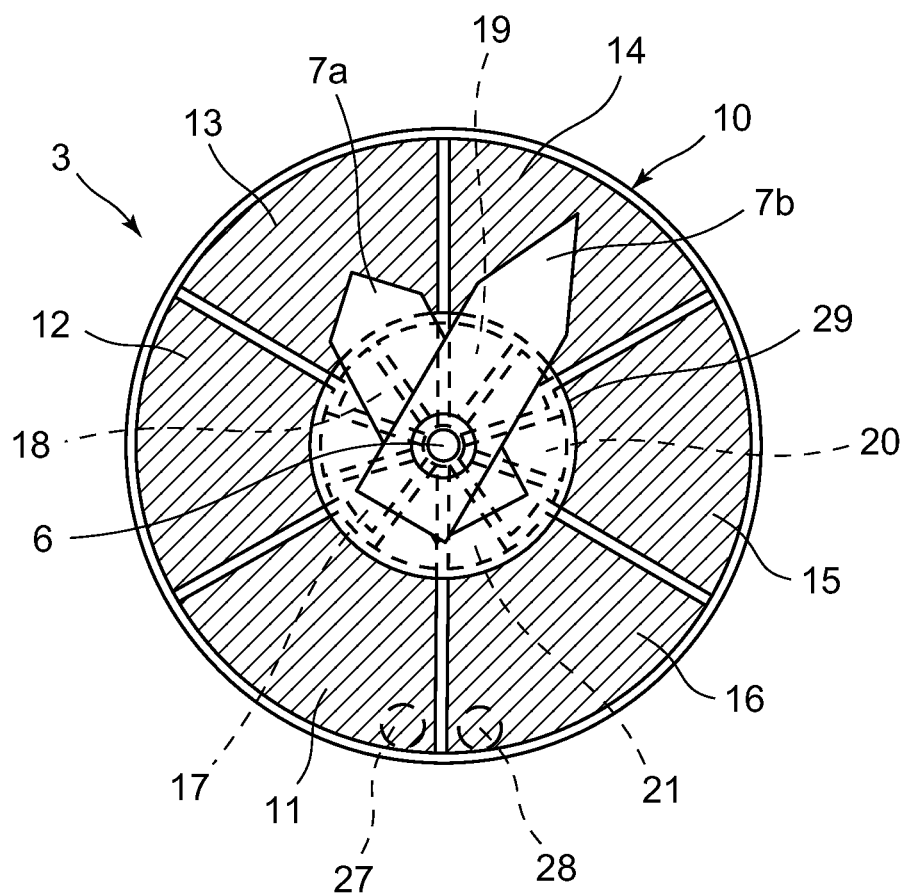
FIG. 6 is an enlarged front view of the state in which pointers have been mounted by shield printing of each connection section of the solar panel depicted in FIG. 4.

These connection sections 17 to 21 are covered by a printing layer for shielding 29, as depicted in FIG. 6.

In this case, the plurality of connection sections 17 to 21 and the printing layer for shielding 29 are formed to have a minimum area by positioning a mask for patterning with the shaft insertion hole 3a provided to the film substrate 10 as a positioning reference, and performing patterning in this state.

The first solar cell 11 and the sixth solar cell 16 are connected to paired connection electrodes 27 and 28, as depicted in FIG. 4 and FIG. 6.

These paired connection electrodes 27 and 28 are provided on the lower surface of the film substrate 10 in areas where the outer perimeters of the first solar cell 11 and the sixth solar cell 16 are adjacent to each other.

That is, of these paired connection electrodes 27 and 28, one connection electrode 27 is provided on the lower surface of the film substrate 10 in an area corresponding to the outer perimeter of the first solar cell 11, and is electrically connected to the lower electrode 22 of the first solar cell 11 via a through hole (not shown), as depicted in FIG. 4 and FIG. 6.

The other connection electrode 28 is provided on the lower surface of the film substrate 10 in an area corresponding to the outer perimeter of the sixth solar cell 16, and is electrically connected to the upper electrode 24 of the sixth solar cell 16 via a through hole (not shown).

These paired connection electrodes 27 and 28 are electrically connected to a circuit substrate (not shown) in the timepiece module 1.

As a result the solar panel 3 is structured such that power generated in each of the solar cells 11 to 16 is sent from the paired connection electrodes 27 and 28 to a rechargeable battery (not shown) of the circuit substrate for charge and the power charged in the rechargeable batter is supplied to the circuit substrate and the timepiece movement 5, as depicted in FIG. 4 and FIG. 6.

Next, the operation of this wristwatch is described.

Normally, by power being supplied to the timepiece movement 5, the timepiece movement 5 operates to rotate the pointer shaft 6, and the pointer shaft 6 moves the pointers 7 such as the hour hand 7a and the minute hand 7h above the dial plate 4 to indicate the time.

Here, the dial plate 4 is radiated with external light such as sunlight, and the radiated external light passes through the dial plate 4 to radiate each of the plurality of solar cells 11 to 16 of the solar panel 3.

Then, the external light passes through the transparent protective film 25 and the transparent upper electrode 24 of each of the solar cells 11 to 16 to be applied to each power-generating layer 23, and each power-generating layer 23 generates power by this radiated external light.

That is, when radiated with external light, each power-generating layer 23 generates an electromotive force according to the radiation amount.

The generated electromotive force is sent by each of the connection sections 17 to 21 from the connection electrode 27 of the first solar cell 11 and the connection electrode 28 of the sixth solar cell 16 to the rechargeable battery of the circuit substrate (the latter two are both not shown) in the timepiece module 1 for recharge.

As such, when the solar panel 3 generates power, external light radiated to the solar pane is shielded by the pointers 7 moving above the dial plate 4, as depicted in FIG. 6.

Therefore, the power generation amount of one of the first to sixth solar cells 11 to 16 corresponding to the pointers 7 is slightly decreased.

Accordingly, the current value to be outputted from the solar panel 3 is minimum among current values occurring by power generation at each of the solar cells 11 to 16, and the upper limit of the current value to be outputted from one of the solar cells 11 to 16 corresponding to the pointers 7 is limited.

In this case, the connection sections 17 to 21 sequentially connecting the plurality of solar cells 11 to 16 in series are provided near a center portion where the plurality of solar cells 11 to 16 are close to each other.

That is, the connection sections 17 to 21 are provided in an annular shape along the outer perimeter of the shaft insertion hole 3a provided to vertically penetrate through the center portion of the film substrate 10 in the solar panel 3.

As a result, the plurality of connection sections 17 to 21 can be arranged in an area near the pointer shaft 6 which is the rotation center of the pointers 7, whereby the connection sections 17 to 21 can be each put in an area shadowed by the pointers near the rotation center of the pointers 7 in the solar panel 3.

Accordingly, in the solar panel 3, the decrease of the light-receiving areas of the plurality of solar cells 11 to 16 due to the plurality of connection sections 17 to 21 can be reduced, compared with the case where the plurality of connection sections are provided on the outer perimeters of the solar cells.

Also, since the plurality of connection sections 17 to 21 are provided in an annular shape along the outer perimeter of the shaft insertion hole 3a, each connection distance of the plurality of connection sections 17 to 21 is short, whereby electric resistance due to these connection sections 17 to 21 can be reduced and electric power losses due to the electric resistance can be reduced.

Furthermore, in this case, the plurality of solar cells 11 to 16 are each formed in a fan shape and arranged in a circular shape, and the plurality of connection sections 17 to 21 are provided in an annular shape along the outer perimeter of the shaft insertion hole 3a which is near the center of the circular shape.

As a result, compared with the case where the plurality of connection sections are provided to the outer perimeters of the solar cells, an electromotive current generated by each of the solar cells 11 to 16 uniformly and regularly flows toward each of the connection sections 17 to 21, whereby stable electric power can be obtained and electric power losses due to the electric resistance can be reduced.

Still further, the solar cells 11 to 16 in areas where the plurality of connection sections 17 to 21 are arranged are formed by equidistant division in a circumferential direction of each solar cell, whereby the plurality of connection sections 17 to 21 can be uniformly formed and variations in the plurality of connection sections 17 to 21 can be reduced.

As a result, the solar cells 11 to 16 allow the length of each of the connection sections 17 to 21 to be uniformly shortened.

As such, the solar panel 3 of the wristwatch includes the plurality of solar cells 11 to 16 which are arranged in a substantially circular shape, and the plurality of connection sections 17 to 21 which are provided near a center portion where the plurality of solar cells 11 to 16 are all close to each other, and electrically connects the plurality of solar cells 11 to 16.

As a result, in the solar panel 3, the light-receiving area can be increased and losses of electric power due to changes of the light-receiving area can be reduced, whereby the power generation efficiency can be enhanced.

That is, in the solar panel 3, the plurality of connection sections 17 to 21 can be centrally arranged near the center portion where the plurality of solar cells 11 to 16 are all close to each other, whereby a decrease in light-receiving area of each of the solar cells 11 to 16 due to the plurality of connection sections 17 to 21 can be reduced.

Yet still further, fluctuations in light-receiving area due to the plurality of pointers 7 moving over the solar cells 11 to 16 can be reduced.

Accordingly, in the solar panel 3, the light receiving area of each of the plurality of solar cells 11 to 16 can be increased, and losses of electric power due to changes of the light-receiving area can be significantly reduced, whereby the power generation efficiency can be enhanced.

In this case, the plurality of connection sections 17 to 21 are provided near the center portion where the plurality of solar cells 11 to 16 are close to each other. Therefore, compared with the case where the plurality of connection sections are provided on the outer perimeter of the respective solar cells, the distance of an electromotive current flowing toward each of the connection sections 17 to 21 can be uniformly and regularly shortened. By this structure as well, the power generation efficiency can be enhanced.

The plurality of solar cells 11 to 16 are formed such that their light-receiving areas are identical even when their shapes are different.

As a result, when each of the solar cells 11 to 16 is radiated with external light such as sunlight the solar cells 11 to 16 can generate substantially same electric power.

Thus, the solar panel 3 can efficiently generate electric power.

The plurality of connection sections 17 to 21 sequentially connect, in series the plurality of solar cells 11 to 16 adjacent to each other, whereby the current value to be outputted from the solar panel 3 is equal to the minimum value among the current values occurring from power generation at the solar cells 11 to 16.

However, since the solar cells 11 to 16 can generate the same amount of electric power, the solar panel 3 can generate stable electric power.

That is, in the solar panel 3, the plurality of solar cells 11 to 16 each have the power-generating layer 23 between the lower electrode 22 and the upper electrode 24, and the plurality of connection sections 17 to 21 each connect the lower electrode 22 of one of solar cells adjacent to each other among the plurality of solar cells 11 to 16 and the upper electrode 24 of the other solar cell adjacent to this solar cell. Accordingly, the plurality of solar cells 11 to 16 adjacent to each other can be sequentially connected in series, whereby stable electric power can be generated.

Also, in the solar panel 3, the shaft insertion hole 3a where the pointer shaft 6 for moving the pointers 7 is inserted has been provided in the center portion where the plurality of solar cells 11 to 16 are all close to each other, whereby the shaft insertion hole 3a can be used as a positioning reference.

Accordingly, the solar cells 11 to 16 can be accurately formed by being arranged in a circular shape such that the light-receiving areas of the plurality of solar cells 11 to 16 have the same size.

In this case, when the plurality of connection sections 17 to 21 which connect the plurality of solar cells 11 to 16 and the printing layer for shielding 29 which covers these connection sections 17 to 21 are to be formed for the solar panel 3, the shaft insertion hole 3a provided to the film substrate 10 is taken as a positioning reference, whereby a mask for patterning can be accurately positioned for patterning.

Accordingly, with this solar panel 3, the plurality of connection sections 17 to 21 can be accurately formed, and the printing layer for shielding 29 can be formed to have a minimum area, whereby the light-receiving area can be widened.

Furthermore, in the solar panel 3, the plurality of connection sections 17 to 21 are provided in an annular shape along the outer perimeter of the shaft insertion hole 3a, whereby the arrangement areas of the plurality of connection sections 17 to 21 can be centrally and compactly set on the outer perimeter of the shaft insertion hole 3a.

As a result, variations in the arrangement of the plurality of connection sections 17 to 21 can be prevented, and each of the connection sections 17 to 21 can be put in an area shadowed by the pointers 7 near the rotation center of the pointers 7.

Still further, the plurality of connection sections 17 to 21 are provided in an annular shape along the outer perimeter of the shaft insertion hole 3a, whereby the arrangement shape of the plurality of connection sections 17 to 21 is simplified.

Yet still further, designing of the solar cells 11 to 16 including areas calculation can be facilitated.

As a result, the time for designing the solar cells 11 to 16 can be reduced.

In this case, radiated external light is shielded by the pointers 7, electric power generation of one of the first to sixth solar cells 11 to 16 facing the pointers 7 is slightly decreased, the current value to be outputted from the solar panel 3 is a minimum value among the current values occurring from power generation at the solar cells 11 to 16, and the upper limit of the current value of one of the solar cells 11 to 16 corresponding to the pointers 7 is limited.

In consideration of the above, designing of the solar cells 11 to 16 including are calculation can be facilitated.

Yet still further, in the solar panel 3, the number of the plurality of solar cells 11 to 16 is six, and the number of the plurality of connection sections 17 to 21 is five, which is smaller in number by 1 than the number of the plurality of solar cells 11 to 16.

As a result, a decrease of the light receiving area of each of the plurality of solar cells 11 to 16 due to the plurality of connection sections 17 to 21 can be reduced, whereby the power generation efficiency can be improved.

Second Embodiment

Next, a second embodiment in which the present invention has been applied to a wristwatch is described below with reference to FIG. 7 and FIG. 8.

Note that components identical to those of the first embodiment depicted in FIG. 1 to FIG. 6 are provided with the same reference numerals for description.

Figure 7:
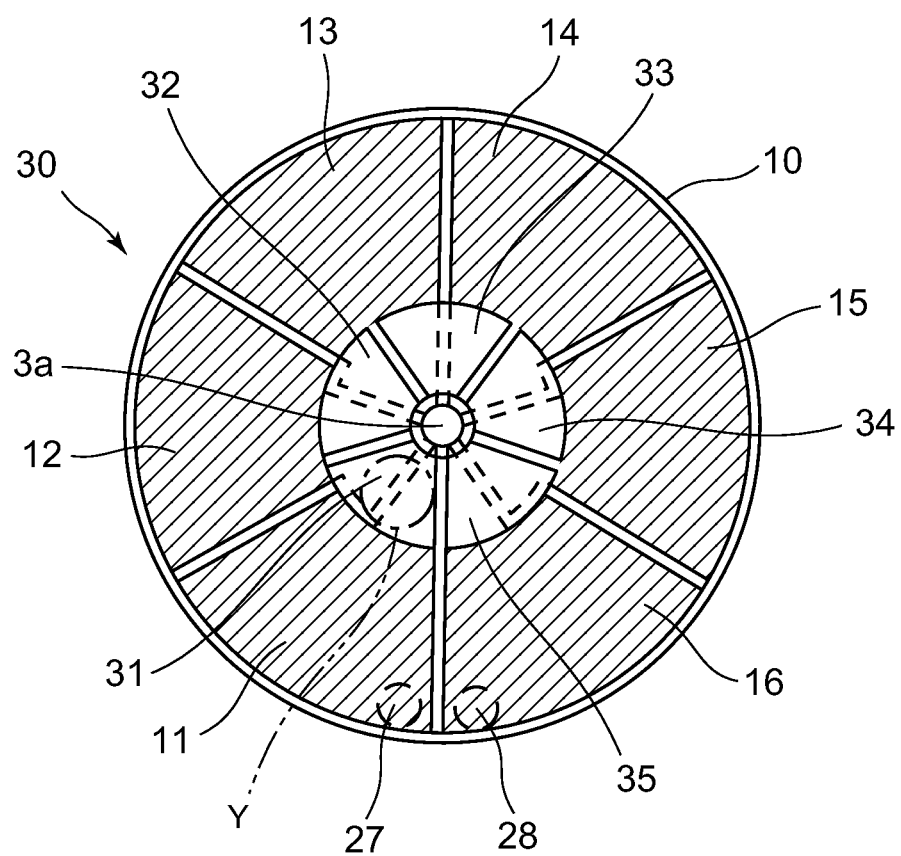
FIG. 7 is an enlarged front view of a solar panel in a second embodiment in which the present invention has been applied to a wristwatch.
Figure 8:
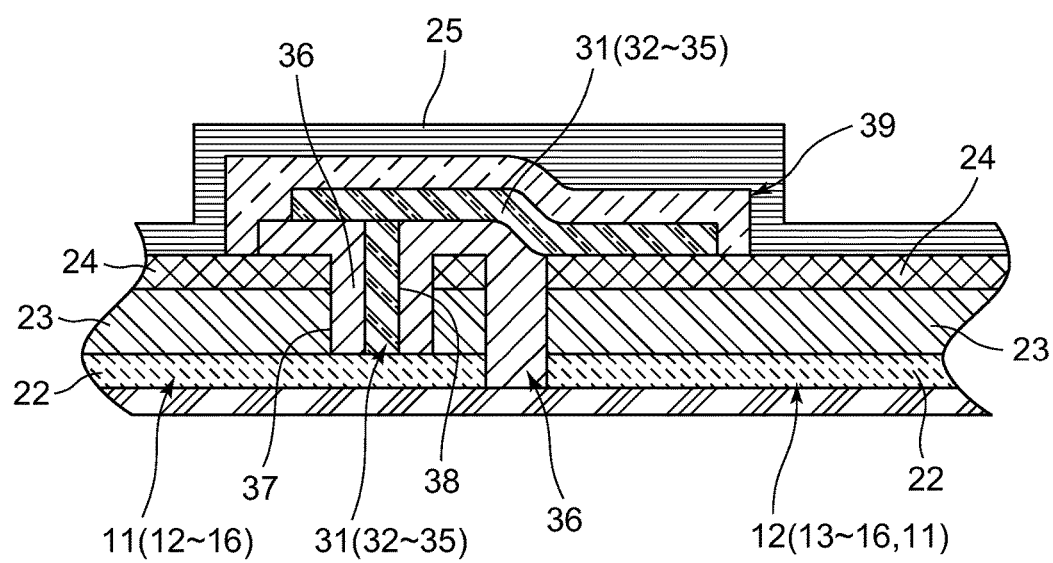
FIG. 8 is an enlarged sectional view of a Y section of the solar panel depicted in FIG. 7.

As depicted in FIG. 7 and FIG. 8, a solar panel 30 of the wristwatch includes a plurality of connection sections 31 to 35 structured differently from the first embodiment. Except for this point, the solar panel 30 is identical in structure to that of the first embodiment.

That is, as depicted in FIG. 8, the plurality of connection sections 31 to 35 are each formed of a conductive paste, and connect the lower electrode 22 of one of solar cells adjacent to each other among the solar cells 11 to 16 and the upper electrode 24 of the other solar cell adjacent thereto.

In this case, among the solar cells 11 to 16 adjacent to each other, the first solar cell 11 and the second solar cell 12 are separated by an insulating layer 36 formed therebetween.

The first solar cell 11 positioned in an area adjacent to the insulating layer 36 has a via hole 37 formed in a part of the upper electrode 24 and the power-generating, layer 23 by a laser beam, and the bottom portion of the via hole 37 corresponds to the lower electrode 22.

The insulating layer 36 is formed on the upper surface of the upper electrode 24 of the first solar cell 11 and the inner side of the via hole 37.

This insulating layer 36 is identical to the insulating layer 36 formed between the first solar cell 11 and the second solar cell 12.

In this state, the insulating layer 36 inside the via hole 37 has a through hole 38 formed by a laser beam.

The bottom portion of the through hole 38 corresponds to the upper surface of the lower electrode 22.

The conductive paste is applied to the inner side of the through hole 38, the upper surface of the insulating layer 36, and the upper surface of the upper electrode 24 of the second solar cell 12, and is patterned, whereby the connection section 31 is formed.

The connection section 31 electrically connects the lower electrode 22 of the first solar cell 11 and the upper electrode 24 of the second solar cell 12 adjacent thereto via the through hole 38, as depicted in FIG. 8.

In this state, a printing layer for shielding 39 is formed on the upper surface of the connection section 31, the insulating layer 36 positioned on the outer perimeter of the connection section 31, a part of the upper electrode 24 of the first solar cell 11, and a part of the upper electrode 24 of the second solar cell 12.

The upper electrode 24 of the first solar cell 11, the upper electrode 24 of the second solar cell 12, and the printing layer 39 covering the connection section 31 are covered by the insulating transparent protective film 25, as with the first embodiment.

Similarly, the lower electrode 22 of the second solar cell 12 and the upper electrode 24 of the third solar cell 13 are electrically connected by the connection section 32, as depicted in FIG. 7.

Also, the lower electrode 22 of the third solar cell 13 and the upper electrode 24 of the fourth solar cell 14 are electrically connected by the connection section 33, and the lower electrode 22 of the fourth solar cell 14 and the upper electrode 24 of the fifth solar cell 15 are electrically connected by the connection section 34, as depicted in FIG. 7.

Moreover, the lower electrode 22 of the fifth solar cell 15 and the upper electrode 24 of the sixth solar cell 16 are electrically connected by the connection section 35.

With the solar panel 30 described above, the operations and effects similar to those of the first embodiment can be achieved. Also, when the plurality of connection sections 31 to 35 sequentially connect in series, the plurality of solar cells 11 to 16 adjacent to each other, the lower electrode 22 of one of solar cells adjacent to each other among the plurality of solar cells 11 to 16 and the upper electrode 24 of the other solar cell adjacent thereto can be reliably connected by the plurality of connection sections 31 to 35, whereby electric power can be efficiently generated, as with the first embodiment.

In this case as well, the plurality of connection sections 31 to 35 are formed in an annular shape along the outer perimeter of the shaft insertion hole 3a in which the pointer shaft 6 for moving the pointers 7, which has been provided at the center portion where the plurality of solar cells 11 to 16 are all close to each other, is inserted.

As a result, the arrangement areas of the plurality of connection sections 31 to 35 can be centrally and compactly set on the perimeter of the shaft insertion hole 3a, as with the first embodiment.

As a result, variations in arrangement of the plurality of connection sections 31 to 35 can be prevented, and each of the connection sections 31 to 35 can be put in an area shadowed by the pointers 7 near the rotation center of the pointers 7.

Accordingly, the decrease of the light-receiving areas of the plurality of solar cells 11 to 16 due to the plurality of connection sections 31 to 35 can be reduced as compared with the case where the plurality of connection sections are provided on the outer perimeters of the solar cells, whereby the light-receiving area of each of the solar cells 11 to 16 can be widened.

Also, in the solar panel 30, the shaft insertion hole 3a where the pointer shaft 6 for moving the pointers 7 is inserted has been provided in the center portion where the plurality of solar cells 11 to 16 are all close to each other, whereby the shaft insertion hole 3a can be used as a positioning reference.

Accordingly, the solar cells 11 to 16 can be accurately formed by being arranged in a circular shape such that the light-receiving areas of the plurality of solar cells 11 to 16 have the same size.

In this case as well, when the plurality of connection sections 31 to 35 which connect the plurality of solar cells 11 to 16 and the printing layer for shielding 39 which covers these connection sections 31 to 35 are to be formed for the solar panel 30, the shaft insertion hole 3a provided to the film, substrate 10 is taken as a positioning reference, whereby a mask for patterning can be accurately positioned for patterning.

As a result, the plurality of connection sections 31 to 35 can be accurately formed, and the printing layer for shielding 39 can be formed to have a minimum area, whereby the light-receiving area can be widened.

In the above-described first and second embodiments, all of the first to fifth connection sections 17 to 21, 31 to 35 connecting the solar cells 11 to 16 of the solar panel 3, 30 are provided to be close to the outer perimeter of the shaft insertion hole 3a provided to the film substrate 10.

Figure 9:
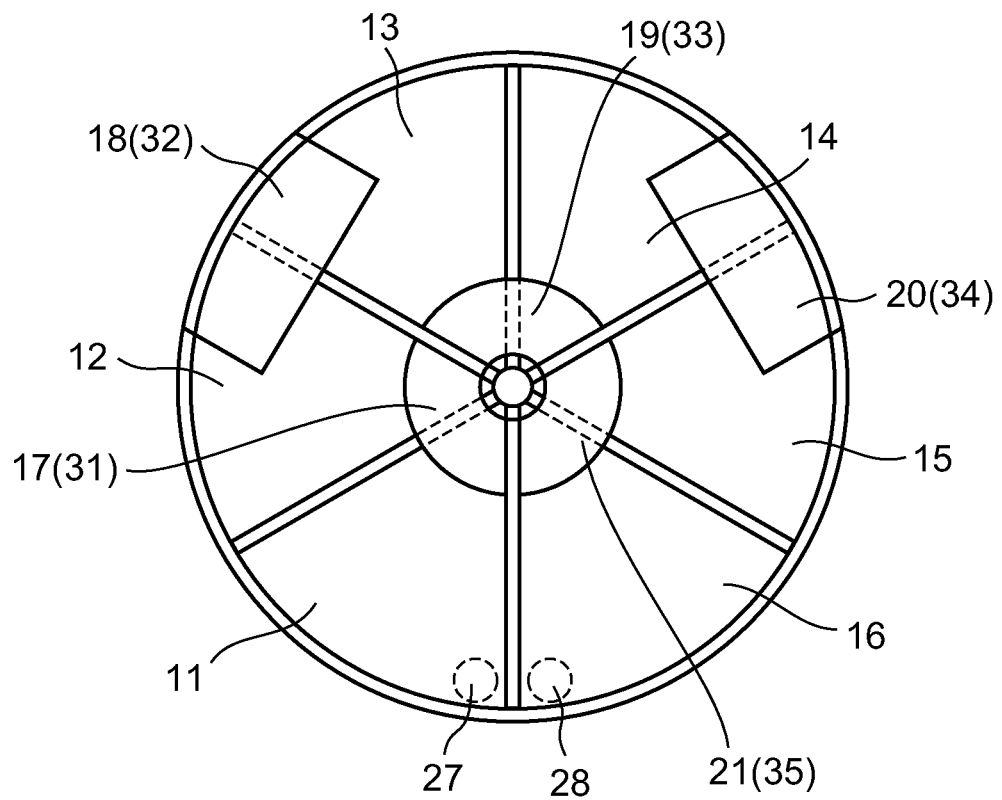
FIG. 9 is an enlarged front view of connection sections of a solar panel according to a first modification of the present invention.

However, the present invention is not limited thereto. For example, as in a first modification example depicted in FIG. 9, the first to fifth connection sections 17 to 21, 31 to 35 may be structured to be provided alternately near the center portion of the solar panel 3, 30 and near the outer perimeter of the solar panel 3, 30.

That is, the first connection section 17, 31 connecting the first solar cell 11 and the second solar cell 12 is provided near the center portion which is on the outer perimeter of the shaft insertion hole 3a, and the second connection section 18, 32 connecting the second solar cell 12 and the third solar cell 13 is provided near the outer perimeter edges of the second solar cell 12 and the third solar cell 13.

Similarly, the third connection section 19, 33 connecting the third solar cell 13 and the fourth solar cell 14 is provided near the center portion which is on the outer perimeter of the shaft insertion hole 3a, the fourth connection section 20, 33 connecting the fourth solar cell 14 and the fifth solar cell 15 is provided near the outer perimeter edges of these solar cells, and the fifth connection section 21, 35 connecting the fifth solar cell 15 and the sixth solar cell 16 is provided near the center portion which is on the outer perimeter of the shaft insertion hole 3*a*.

If the first to fifth connection sections 17 to 21, 31 to 35 are provided alternately near the center portion of the solar panel 3, 30 and near the outer perimeter of the solar panel 3, 30 as described for the first modification example, the current flow in each of the first to sixth solar cells 11 to 16 becomes efficient by the first to fifth connection sections 17 to 21, 31 to 35, whereby, in particular, current characteristics in high luminance can be improved.

Also, in the above-described first and second embodiments the solar panel 3, 30 is divided into six solar cells 11 to 16, and provided with five connection sections 17 to 21, 31 to 35 which connect these solar cells.

However, the present invention is not limited thereto, and the number of solar cells and the number of connection sections arranged may be any as long as the solar panel is divided into n solar cells and (n−1) connection sections are provided.

Figure 10:
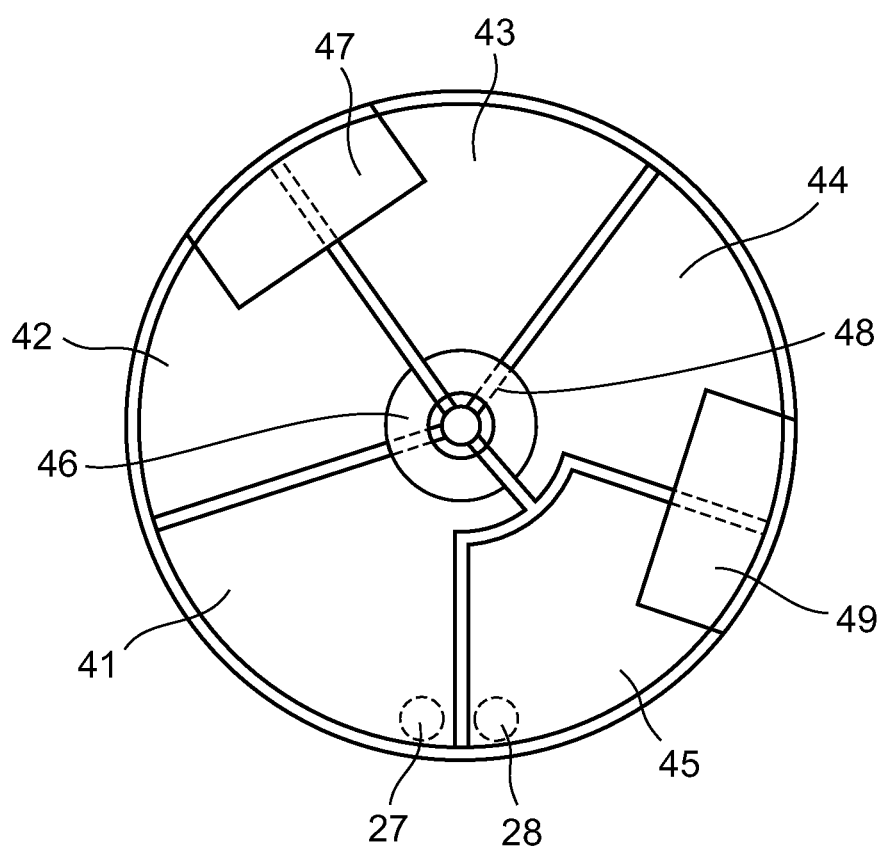
FIG. 10 is an enlarged front view of a solar panel according to a second modification of the present invention.

For example, the solar panel may be divided into five solar cells as the second modification example depicted in FIG. 10.

In this case, solar cells 41 to 45 may have different shapes as long as they are formed to have identical light-receiving areas.

In this case as well, as with the first modification example, first to fourth connection sections 46 to 49 connecting the solar cells 41 to 45 may be structured to be provided to an area near the center portion and an area near the outer perimeter alternately.

Also, in the above-described first and second embodiments, the solar panel 3, 30 is formed such that the connection sections 17 to 21, 31 to 35 connecting the solar cells 11 to 16 of the solar panel 3, 30 are arranged in a circular shape.

Figure 11:
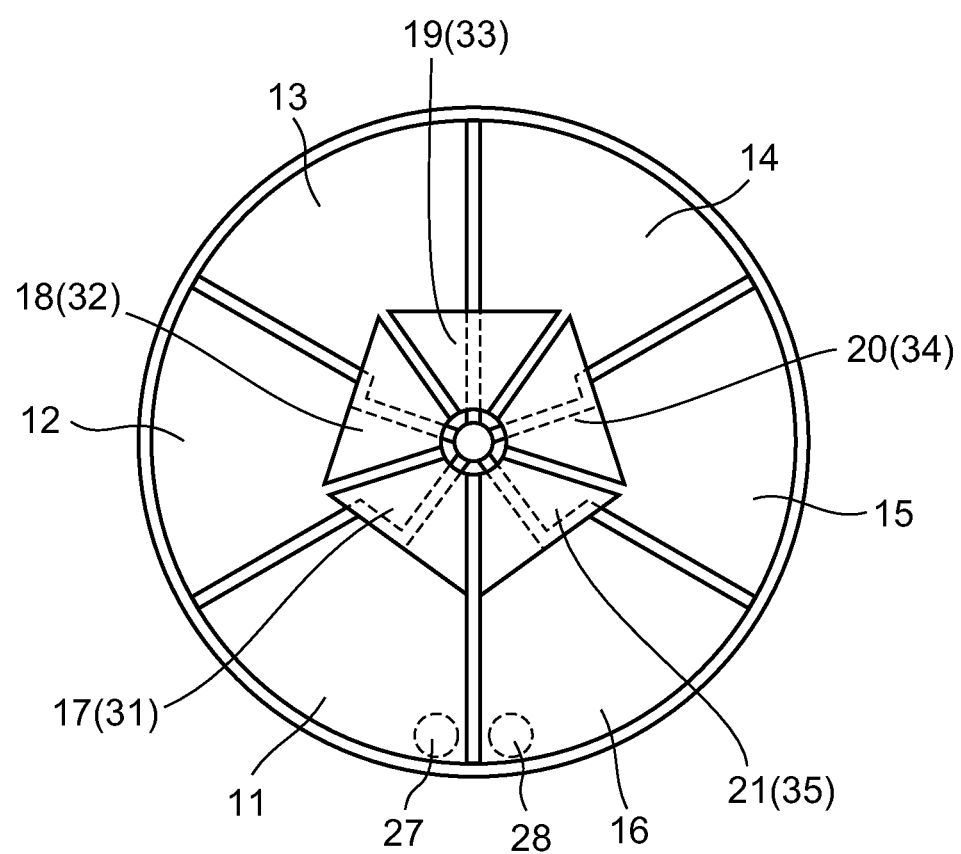
FIG. 11 is an enlarged front view of connection sections of a solar panel according to a third modification of the present invention.

However, the present invention is not limited thereto. For example, the connection sections may be arranged so as to form a polygonal shape according to the number of connection sections, such as a pentagonal shape when the number of connection sections is five, as a third modification example depicted in FIG. 11.

Moreover, in the above-described first and second embodiments, the present invention is applied to a wristwatch. However, the present invention is not necessarily required to be applied to a wristwatch, and can be applied to various timepieces such as a travel watch, an alarm clock, a desk clock, and a wall clock.

Furthermore, the present invention is not necessarily required to be applied to a timepiece, and can be applied to another electronic device.

While the present invention has been described with reference to the preferred embodiments, it is intended that the invention be not limited by any of the details of the description therein but includes all the embodiments which fall within the scope of the appended claims.

What is claimed is:

1. A solar panel comprising:
a substrate;
a plurality of fan-shaped solar cells arranged on an upper surface of the substrate in a substantially circular shape;
a plurality of connection sections which are provided at a position near a center portion of the solar panel where the plurality of fan-shaped solar cells of the substrate are all close to each other, and which electrically sequentially connect the plurality of fan-shaped solar cells only near the center portion of the solar panel; and
a shaft insertion hole provided at the center portion of the solar panel where the plurality of fan-shaped solar cells are all close to each other, in which a pointer shaft for moving a pointer is insertable,
wherein the plurality of fan-shaped solar cells each have a power-generating layer between a lower electrode and an upper electrode,
wherein all of the plurality of connection sections are provided close to each other in an annular shape along an outer perimeter of the shaft insertion hole, and each of the plurality of connection sections is centrally located in an area adjacent to the shaft insertion hole, at a position cast in shadow by the pointer, and in an area between a center portion of each of the solar cells and an end portion of each of the solar cells adjacent to the shaft insertion hole, and
wherein the plurality of connection sections each connect the lower electrode of one of the fan-shaped solar cells adjacent to each other among the plurality of fan-shaped solar cells, and the upper electrode of another one of the fan-shaped solar cells adjacent to the one fan-shaped solar cell.

2. The solar panel according to claim 1, wherein the plurality of fan-shaped solar cells are formed to have identical light-receiving areas.

3. The solar panel according to claim 1, wherein the plurality of connection sections sequentially connect, in series, the plurality of fan-shaped solar cells adjacent to each other.

4. The solar panel according to claim 1, wherein the plurality of connection sections are smaller in number by 1 than the plurality of fan-shaped solar cells.

5. The solar panel according to claim 1, further comprising a shield layer which is arranged around the shaft insertion hole and covers the plurality of connection sections.

6. The solar panel according to claim 1, wherein each of the plurality of connection sections comprises a continuous layer extending from the lower electrode of one of the fan-shaped solar cells adjacent to each other among the plurality of fan-shaped solar cells, to the upper electrode of another one of the fan-shaped solar cells adjacent to the one fan-shaped solar cell.

7. The solar panel according to claim 6, wherein each of the plurality of connection sections comprises a conductive paste.

8. A timepiece comprising:
a housing;
the solar panel according to claim 1;
a dial plate provided on the solar panel;
a pointer shaft inserted into the shaft insertion hole of the solar panel;
a pointer mounted on the pointer shaft; and
a timepiece movement which is provided in the housing and rotates the pointer shaft.

9. The solar panel according to claim 5, wherein the shield layer covers all of the plurality of connection sections.

10. The solar panel according to claim 5, wherein the shield layer is a printed layer.

11. The solar panel according to claim 5, wherein the shield layer is provided directly on the connection sections.

12. The solar panel according to claim 1, further comprising insulating layers provided between adjacent ones of the fan-shaped solar cells,
wherein the plurality of connection sections each connect the lower electrode of one of the fan-shaped solar cells adjacent to each other among the plurality of fan-shaped solar cells, and the upper electrode of another one of the fan-shaped solar cells adjacent to the one fan-shaped solar cell, by extending from the lower electrode of the one of the fan-shaped solar cells to the upper electrode of the another one of the fan-shaped solar cells over the insulating layer provided between the one of the fan-shaped solar cells and the another one of the fan-shaped solar cells.

13. The solar panel according to claim 1, wherein the one of the fan-shaped solar cells adjacent to each other among the plurality of fan-shaped solar cells has a via hole formed in a part of the upper electrode and the power generating layer thereof to expose the lower electrode thereof at a bottom of the via hole, wherein the lower electrode of the one of the fan-shaped solar cells is connected to the upper electrode of the another one of the fan-shaped solar cells, by one of the connection sections through the via hole.

* * * * *